United States Patent
Yamaguchi

(10) Patent No.: US 11,929,269 B2
(45) Date of Patent: Mar. 12, 2024

(54) CONTROL METHOD, MEASUREMENT METHOD, CONTROL DEVICE, AND HEAT TREATMENT APPARATUS

(71) Applicant: Tokyo Electron Limited, Tokyo (JP)

(72) Inventor: Tatsuya Yamaguchi, Iwate (JP)

(73) Assignee: TOKYO ELECTRON LIMITED, Tokyo (JP)

(*) Notice: Subject to any disclaimer, the term of this patent is extended or adjusted under 35 U.S.C. 154(b) by 171 days.

(21) Appl. No.: 16/851,140

(22) Filed: Apr. 17, 2020

(65) Prior Publication Data

US 2020/0343114 A1  Oct. 29, 2020

(30) Foreign Application Priority Data

Apr. 23, 2019 (JP) ................. 2019-082131

(51) Int. Cl.
  *H01L 21/67* (2006.01)
  *G05B 13/04* (2006.01)
  *G06F 1/20* (2006.01)

(52) U.S. Cl.
  CPC ...... *H01L 21/67248* (2013.01); *G05B 13/042* (2013.01); *G06F 1/206* (2013.01); *H01L 21/67253* (2013.01); *H01L 21/67276* (2013.01)

(58) Field of Classification Search
  CPC ......... H01L 21/67248; H01L 21/67253; H01L 21/67276; H01L 21/67109; H01L 21/67103; H01L 21/67303; H01L 21/68771; G05B 13/042; G06F 1/206
  USPC ................. 700/300; 219/483, 506
  See application file for complete search history.

(56) References Cited

U.S. PATENT DOCUMENTS

| | | | | |
|---|---|---|---|---|
| 6,207,937 | B1* | 3/2001 | Stoddard | F27D 21/0014 219/497 |
| 6,760,716 | B1* | 7/2004 | Ganesamoorthi | G05B 13/027 706/14 |
| 2007/0118271 | A1* | 5/2007 | Wiseman | G05B 23/0254 701/100 |
| 2008/0028778 | A1* | 2/2008 | Millet | G06F 1/206 62/129 |
| 2008/0202133 | A1* | 8/2008 | Boer | F25D 31/007 62/126 |

(Continued)

FOREIGN PATENT DOCUMENTS

| | | |
|---|---|---|
| JP | 2002-515648 A | 5/2002 |
| JP | 2010-045340 A | 2/2010 |
| JP | 2013-037627 A | 2/2013 |

*Primary Examiner* — Thomas C Lee
*Assistant Examiner* — Michael Tang
(74) *Attorney, Agent, or Firm* — Venjuris, P.C.

(57) ABSTRACT

A control method includes: calculating a correction value after a predetermined process is executed; and controlling a control target based on an output value of at least one of a real sensor and a virtual sensor during execution of the predetermined process. The calculating includes correcting an output value of the virtual sensor. The controlling includes: controlling the control target based on an output value of the real sensor while monitoring a failure of the real sensor; correcting an output value of the virtual sensor with the correction value when the real sensor fails; and switching from a control based on the output value of the real sensor to a control based on the output value of the virtual sensor after the correcting the output value of the virtual sensor.

10 Claims, 8 Drawing Sheets

(56) References Cited

U.S. PATENT DOCUMENTS

| | | | |
|---|---|---|---|
| 2008/0310459 A1* | 12/2008 | Date | H04J 3/0676 370/503 |
| 2009/0063087 A1* | 3/2009 | Grichnik | G05B 17/02 702/127 |
| 2012/0016499 A1* | 1/2012 | Limaye | G05B 19/41875 700/89 |
| 2016/0206837 A1* | 7/2016 | Dong | A61M 16/026 |
| 2017/0161953 A1* | 6/2017 | Hu | G06F 3/011 |
| 2018/0364682 A1* | 12/2018 | Tanaka | G05B 19/416 |
| 2020/0200869 A1* | 6/2020 | Alvarez | G01S 7/40 |

* cited by examiner

| RECIPE C | STEP 1 | STEP 2 | ... | STEP 90 |
|---|---|---|---|---|
| ZONE Za (HEATER 70a) | ** | ** | | ** |
| ZONE Zb (HEATER 70b) | ** | ** | | ** |

| RECIPE B | STEP 1 | STEP 2 | ... | STEP 80 |
|---|---|---|---|---|
| ZONE Za (HEATER 70a) | ** | ** | | ** |
| ZONE Zb (HEATER 70b) | ** | ** | | ** |

| RECIPE A | STEP 1 | STEP 2 | ... | STEP 100 |
|---|---|---|---|---|
| ZONE Za (HEATER 70a) | ** | ** | | ** |
| ZONE Zb (HEATER 70b) | ** | ** | | ** |
| ZONE Zc (HEATER 70c) | ** | ** | | ** |
| ZONE Zd (HEATER 70d) | ** | ** | | ** |
| ZONE Ze (HEATER 70e) | ** | ** | | ** |

CONTROL METHOD, MEASUREMENT METHOD, CONTROL DEVICE, AND HEAT TREATMENT APPARATUS

CROSS-REFERENCE TO RELATED APPLICATION

This application is based on and claims priority from Japanese Patent Application No. 2019-082131 filed on Apr. 23, 2019 with the Japan Patent Office, the disclosure of which is incorporated herein in its entirety by reference.

TECHNICAL FIELD

The present disclosure relates to a control method, a measurement method, a control device, and a heat treatment apparatus.

BACKGROUND

There is a technique for estimating the temperature output from each of a plurality of temperature detectors based on a detection value of a temperature detector other than a failed temperature detector when any of a plurality of temperature detectors fails (see, e.g., Japanese Patent Laid-Open Publication No. 2013-037627).

SUMMARY

A control method according to an aspect of the present disclosure controls a control target based on an output value of at least one of a real sensor and a virtual sensor during execution of a predetermined process. The control method includes: a correction value calculation process executed after an end of the predetermined process; and a control process executed during execution of the predetermined process. The correction value calculation process includes calculating a correction value that corrects the output value of the virtual sensor. The control process includes: controlling the control target based on the output value of the real sensor while monitoring a failure of the real sensor; correcting the output value of the virtual sensor with the correction value, which is executed when the real sensor fails; and switching from a control based on the output value of the real sensor to a control based on the output value of the virtual sensor, which is executed after correcting.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
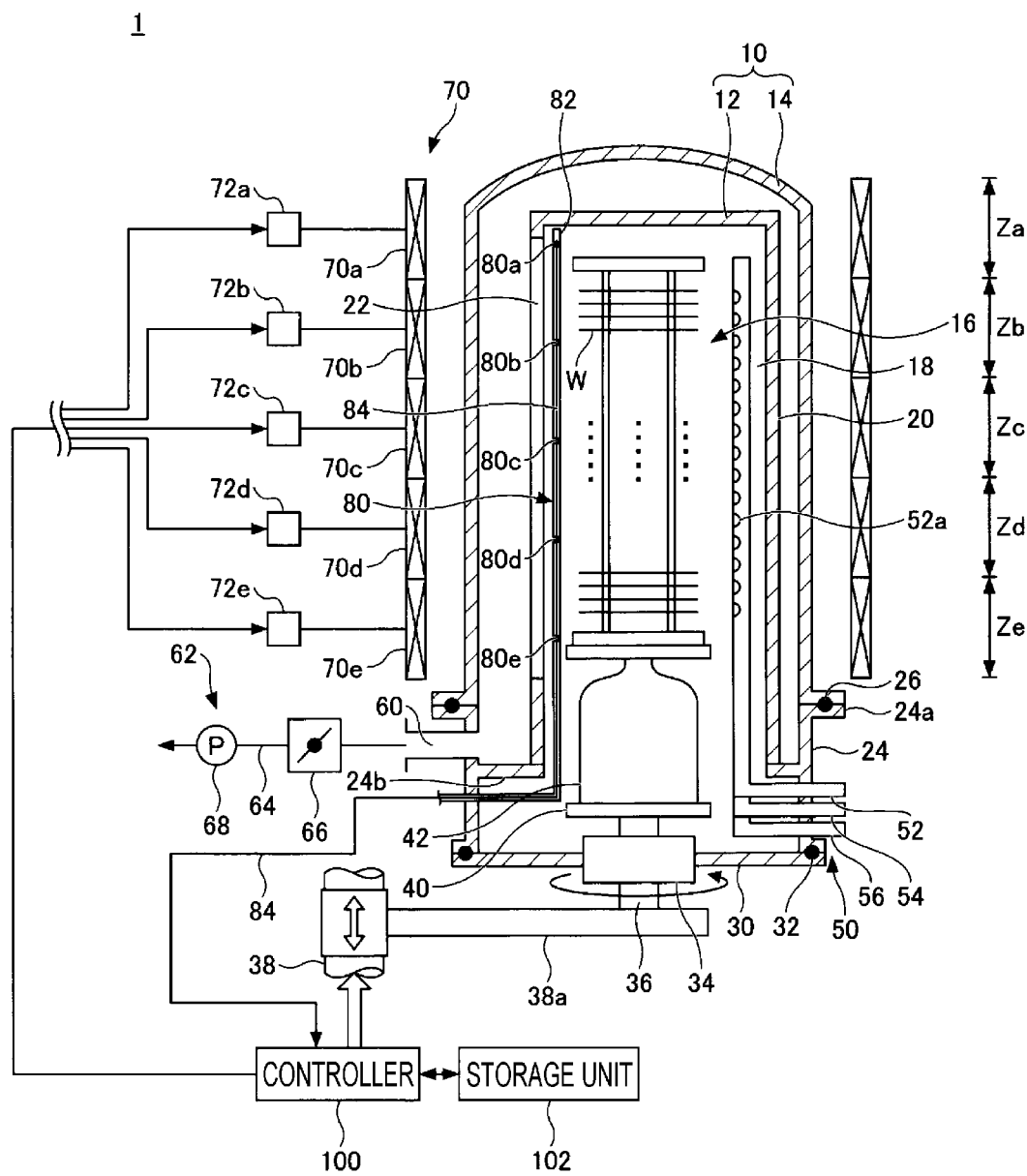
FIG. 1 is a diagram illustrating a configuration example of a heat treatment apparatus.

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

Hereinafter, non-limiting embodiments of the present disclosure will be described with reference to the accompanying drawings. In the accompanying drawings, the same or corresponding members or parts are denoted by the same or corresponding reference numerals, and redundant explanations thereof are omitted.

(Heat Treatment Apparatus)

Figure 2:
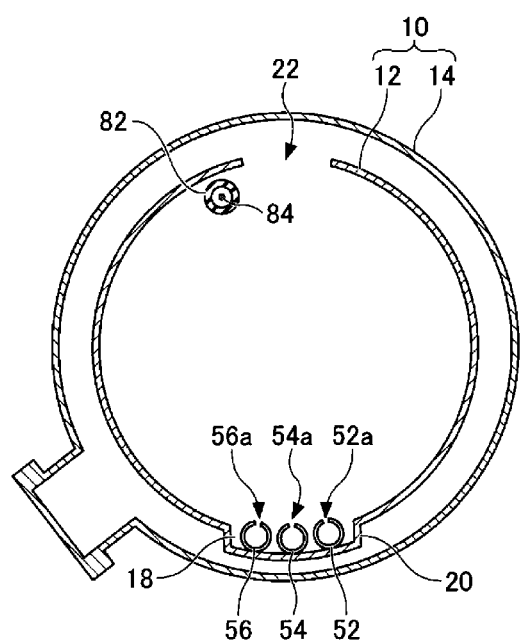
FIG. 2 is a diagram for explaining a processing container in the heat treatment apparatus of FIG. 1.

A heat treatment apparatus of an embodiment will be described. FIG. 1 is a diagram illustrating a configuration example of the heat treatment apparatus according to the embodiment. FIG. 2 is a diagram for explaining a processing container in the heat treatment apparatus of FIG. 1.

As illustrated in FIG. 1, the heat treatment apparatus 1 has a processing container 10. The processing container 10 includes a cylindrical inner tube 12 having a ceiling with an open lower end, and a cylindrical outer tube 14 with an open ceiling to cover the outside of the inner tube 12. The inner tube 12 and the outer tube 14 are formed of a heat-resistant material such as quartz and are arranged coaxially to form a double tube structure. A wafer boat 16 is accommodated in the inner tube 12. The wafer boat 16 is a substrate holder that holds a plurality of semiconductor wafers (hereinafter, referred to as "wafers W") substantially horizontally at predetermined intervals along the vertical direction. The wafer W is an example of a substrate.

The ceiling of the inner tube 12 is, for example, flat. On one side of the inner tube 12, a nozzle accommodating portion 18 is formed along the longitudinal direction (vertical direction) of the inner tube 12 to accommodate a gas nozzle. As illustrated in FIG. 2, the nozzle accommodating portion 18 is, for example, a portion inside a convex portion 20 formed by projecting a part of the side wall of the inner tube 12 outward. A rectangular opening 22 is formed on the side wall of the inner tube 12 opposite to the nozzle accommodating portion 18 along the longitudinal direction (vertical direction) of the inner tube 12.

The opening 22 is a gas exhaust port formed so that the gas in the inner pipe 12 may be exhausted. The length of the opening 22 is formed to be the same as the length of the wafer boat 16, or to extend in the vertical direction longer than the length of the wafer boat 16.

The lower end of the processing container 10 is supported by a cylindrical manifold 24 formed of, for example, stainless steel. A flange 24a is formed at the upper end of the manifold 24, and the lower end of the outer tube 14 is installed and supported on the flange 24a. A seal member 26 such as an O-ring is interposed between the flange 24a and the lower end of the outer tube 14 to make the inside of the outer tube 14 airtight.

An annular support 24b is provided on the upper inner wall of the manifold 24, and the lower end of the inner tube 12 is installed on the support 24b to support it. A lid 30 is hermetically attached to an opening at the lower end of the manifold 24 via a sealing member 32 such as an O-ring, so that an opening at the lower end of the processing container 10, that is, the opening of the manifold 24 is hermetically closed. The lid 30 is formed of, for example, stainless steel.

A rotating shaft 36 is provided at the center of the lid 30 through a magnetic fluid seal 34. A lower portion of the rotating shaft 36 is rotatably supported by an arm 48 of an elevating unit 38 including a boat elevator.

A rotating plate 40 is provided at the upper end of the rotating shaft 36, and the wafer boat 16 that holds the wafer W is placed on the rotating plate 40 via a heat insulating table 42 made of quartz. Therefore, the lid 30 and the wafer boat 16 move up and down as a unit by raising and lowering the elevating unit 38, so that the wafer boat 16 may be inserted into and removed from the processing container 10.

A gas supply 50 is provided in the manifold 24 and introduces a gas into the inner pipe 12. The gas supply 50 has a plurality (three in the illustrated example) of gas nozzles 52, 54, and 56 made of quartz. Each of the gas nozzles 52, 54, and 56 is provided in the inner pipe 12 along the longitudinal direction, and has a base end bent in an L-shape and supported to penetrate through the manifold 24.

As illustrated in FIG. 2, the gas nozzles 52, 54, and 56 are installed in the nozzle accommodating portion 18 of the inner pipe 12 to be aligned in a circumferential direction. Each of the gas nozzles 52, 54, and 56 has a plurality of gas holes 52a, 54a, and 56a formed at predetermined intervals along the longitudinal direction. Each of the gas holes 52a, 54a, and 56a discharges each gas in the horizontal direction. The predetermined interval is set to be the same as, for example, an interval between the wafers W supported on the wafer boat 16. Further, the position in the height direction is set such that each of the gas holes 52a, 54a, and 56a is located in the middle between vertically adjacent wafers W, and each gas may be efficiently supplied to the space between the wafers W. As the type of gas, a film forming gas, an etching gas, and a purge gas are used, and the gases may be supplied through each of the gas nozzles 52, 54, and 56 as needed while controlling the flow rates of the gases.

A gas outlet 60 is formed on the upper side wall of the manifold 24 and above the support 36, and the gas in the inner pipe 12 discharged from the opening 22 through a space between the inner pipe 12 and the outer pipe 14 may be exhausted. The gas outlet 60 is provided with an exhaust unit 62. The exhaust unit 62 has an exhaust passage 64 connected to the gas outlet 60, and a pressure regulating valve 66 and a vacuum pump 68 are sequentially provided in the exhaust passage 64 so that the inside of the processing container 10 may be evacuated.

A cylindrical heater 70 is provided to cover the outer tube 14 around the outer tube 14. The heater 70 heats the wafer W accommodated in the processing container 10.

The space in the processing container 10 is divided into a plurality of unit regions, for example, five unit regions Za, Zb, Zc, Zd, and Ze along the vertical direction. The heater 70 is also divided into heaters 70a, 70b, 70c, 70d, and 70e to correspond one-to-one with the unit region in the vertical direction. The outputs of the heaters 70a to 70e are independently controlled by power controllers 72a to 72e corresponding to the unit regions Za to Ze, respectively.

Further, in the space inside the processing container 10, temperature sensors 80a to 80e for detecting temperature are provided corresponding to the unit regions Za to Ze, respectively. The temperature sensors 80a to 80e are accommodated in a protection tube 82 made of, for example, quartz and provided in the inner tube 12. The temperature sensors 80a to 80e detect temperature in order to detect a temperature distribution along the vertical direction. Detection signals from the temperature sensors 80a to 80e are input to a controller 100 (to be described later) through a signal line 84. The controller 100 to which the detection signals are input calculates the set values of the power controllers 72a to 72e, and outputs the calculated set values to each of the power controllers 72a to 72e. For example, by calculating the set values of the power controllers 72a to 72e by a PID control, the controller 100 controls the output to each of the power controllers 72a to 72e, that is, the amount of heat generated by each of the heaters 70a to 70e. Further, the temperature sensors 80a to 80e may be, for example, thermocouples.

The heat treatment apparatus 1 has a controller 100 such as a computer for controlling the entire operation of the heat treatment apparatus 1. The controller 100 is connected to a storage unit 102 in which a control program for causing the controller 100 to execute various types of process executed by the heat treatment apparatus 1 and various programs for causing each unit of the heat treatment apparatus 1 to execute a process according to processing conditions are stored. The various programs may be stored in a storage medium and then stored in the storage unit 102. The storage medium may be a hard disk or a semiconductor memory or may be a portable medium such as a CD-ROM, a DVD, or a flash memory. Further, data may be appropriately transmitted from another device or a host computer to the storage unit 102 by a wired or wireless communication unit.

The controller 100 may be a control device provided separately from the heat treatment apparatus 1. Further, the storage unit 102 may be a storage device provided separately from the heat treatment apparatus 1.

(Operation Method of Heat Treatment Apparatus)

Figure 3:
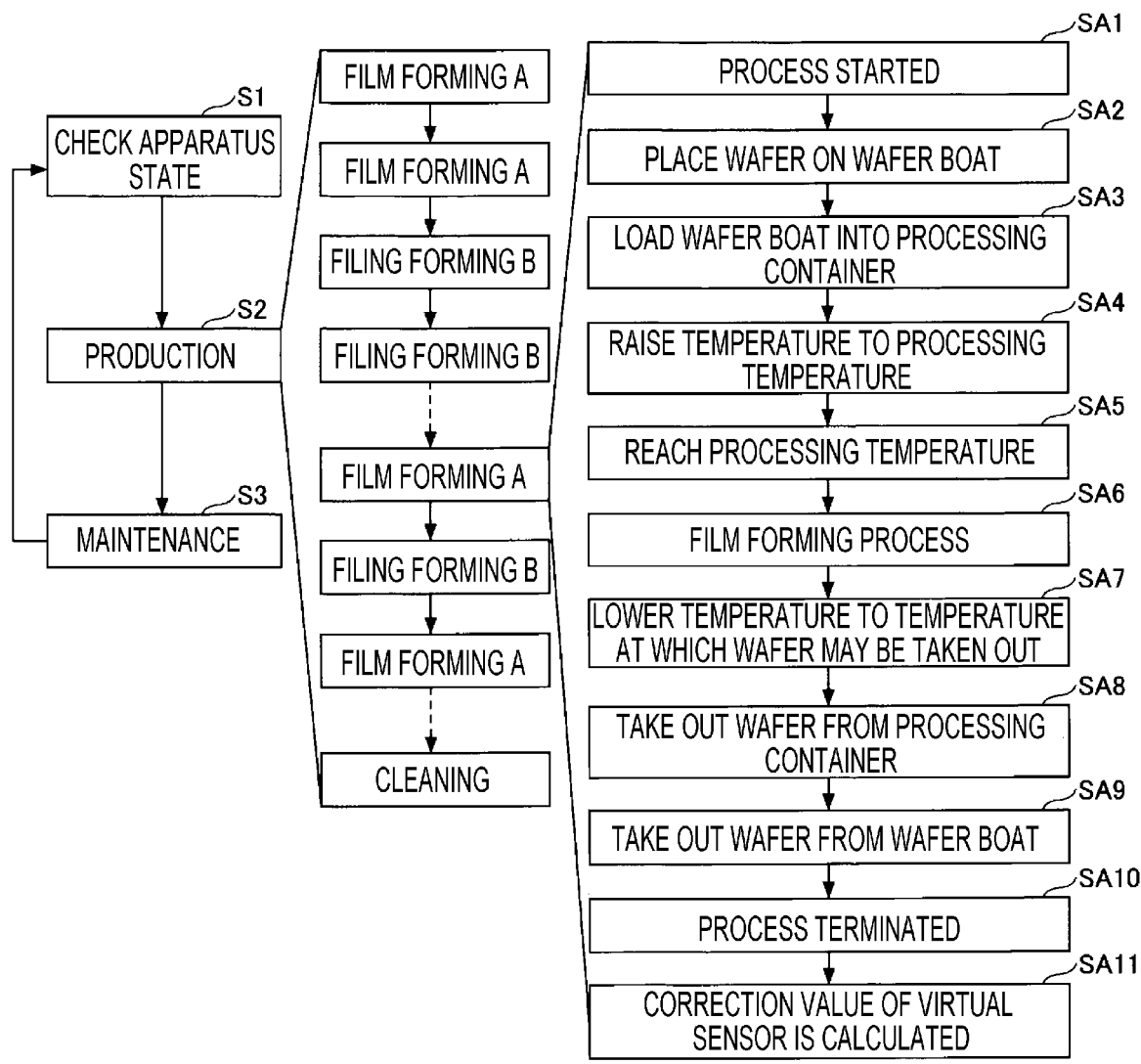
FIG. 3 is a diagram illustrating an example of an operation method of the heat treatment apparatus.

An example of an operation method of the heat treatment apparatus 1 will be described. FIG. 3 is a diagram illustrating an example of an operation method of the heat treatment apparatus 1.

As illustrated in FIG. 3, in the heat treatment apparatus 1, step S1 of checking the state of the apparatus, step S2 of performing production, and step S3 of performing maintenance are repeatedly performed in this order.

Step S1 of checking the state of the apparatus is a step of checking whether the state of the heat treatment apparatus 1 is a state in which it is possible to shift to production. Step S1 of checking the state of the apparatus includes, for example, executing a process using a recipe for checking the state of the apparatus, and determining whether the processing result satisfies a reference value. The process using the recipe for checking the state of the apparatus is executed using, for example, a dummy wafer. When the state of the heat treatment apparatus 1 is in a state in which it is possible to shift to production in step S1 of checking the state of the apparatus, the process shifts to step S2 of performing production.

Step S2 of performing production is a step of performing production using the heat treatment apparatus 1. Step S2 of performing production includes, for example, performing a film forming process and performing a cleaning process. In step S2 of performing production, for example, a film forming process under a single processing condition may be repeatedly performed, or a film forming process under a plurality of different processing conditions may be repeatedly performed. In addition, in step S2 of performing production, a cleaning process of removing deposits deposited in the processing container 10 may be performed after the film forming process is performed.

Step S3 of performing maintenance is a step of returning the state of the heat treatment apparatus 1 to a state before step S2 of performing production. Step S3 of performing maintenance includes, for example, replacing consumable parts used in the heat treatment apparatus 1 and cleaning the inside of the processing container 10.

Hereinafter, step S2 of performing production will be described in detail. In step S2 of performing production, for example, as illustrated in FIG. 3, the cleaning process is performed after the film forming process A and the film forming process B having different processing conditions are repeatedly performed.

The film forming process A includes a plurality of steps SA1 to SA11, for example, as illustrated in FIG. 3. First, when the process is started (step SA1), the wafer W is placed on the wafer boat 16 (step SA2), and the wafer boat 16 on which the wafer W is placed is loaded into the processing container 10 (step SA3).

Subsequently, the wafer W accommodated in the processing container 10 is heated by the heater 70 (step SA4), and the temperature of the wafer W is caused to reach the processing temperature (step SA5). Subsequently, the film forming process is performed on the wafer W while the film forming gas is introduced into the processing container 10 from the gas supply 50 and the pressure in the processing container 10 is adjusted by the pressure regulating valve 66 of the exhaust unit 62 (step SA6). After the film forming process is ended, the temperature of the wafer W is lowered to a temperature at which the wafer W may be unloaded (taken out) from the processing container 10 (step SA7), and then the wafer boat 16 is unloaded from the processing container 10 (step SA8). Subsequently, the wafer W placed on the wafer boat 16 is taken out (step SA9), and the process is ended (step SA10). After the process on the wafer W is ended, a correction value that corrects the output value of the virtual sensor is calculated (step SA11). Thus, the film forming process A is completed. In the film forming process B, similarly to the film forming process A, a correction value that corrects the output value of the virtual sensor is calculated after the process on the wafer W is ended. In the cleaning process, a correction value that corrects the output value of the virtual sensor is calculated after a process of removing the deposit in the processing container 10 using the cleaning gas is ended.

(Correction Value Calculation Process)

Figures 4, 5:
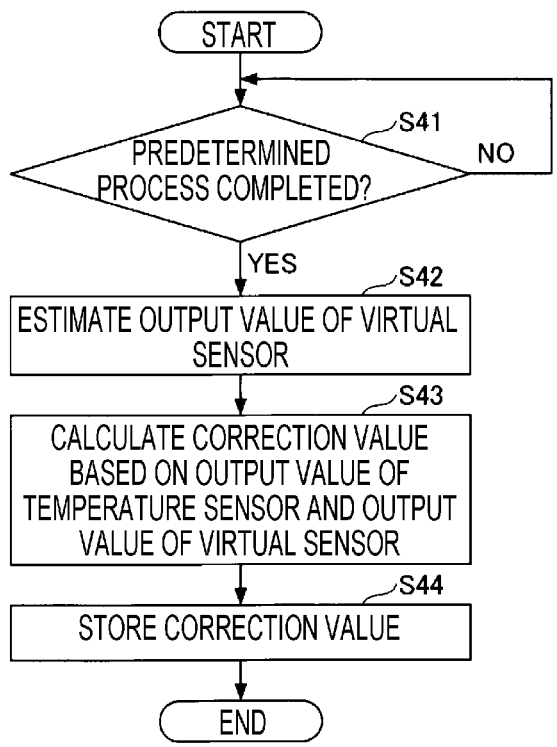
FIG. 4 is a flowchart illustrating an example of a correction value calculation process.
FIG. 5 is a diagram illustrating an example of a correction value table.

Descriptions will be made on a process of calculating a correction value for correcting the output value of the virtual sensor (hereinafter, referred to as a "correction value calculation process"), which is executed after the end of a predetermined process. FIG. 4 is a flowchart illustrating an example of a correction value calculation process. As illustrated in FIG. 4, the correction value calculation process includes steps S41 to S44.

In step S41, the controller 100 determines whether the predetermined process has been completed. The predetermined process may be, for example, a film forming process or a cleaning process. When it is determined in step S41 that the predetermined process has been completed, the process proceeds to step S42. Meanwhile, when it is determined in step S41 that the predetermined process has not been completed, step S41 is repeated.

In step S42, the controller 100 estimates the output value of the virtual sensor in the predetermined process based on the log data obtained when the predetermined process has been executed, by performing a simulation using a known estimation algorithm. As a known estimation algorithm, for example, an estimation algorithm using a Kalman filter may be used.

In step S43, the controller 100 calculates a correction value for correcting the output value of the virtual sensor based on the output values of the temperature sensors 80a to 80e and the output value of the virtual sensor estimated in step S42. The correction value may be, for example, a difference between the output value of the virtual sensor estimated in step S42 and the output values of the temperature sensors 80a to 80e.

In step S44, the controller 100 stores the correction value calculated in step S43 in the storage unit 102 in association with a predetermined process.

FIG. 5 is a diagram illustrating an example of a correction value table. The correction value calculated in step S43 is stored in the storage unit 102 as a correction value table in association with a recipe for executing a predetermined process, for example, as illustrated in FIG. 5. Further, as illustrated in FIG. 5, the correction value calculated in step S43 is stored in the storage unit 102 for each step and for each zone. Each of the correction values may be, for example, an average value of the correction values at a plurality of times of each step. Further, when the correction value of the same recipe is already stored in the storage unit 102, a new correction value may be stored in the storage unit 102 separately from the correction value already stored in the storage unit 102, and the correction value already stored in the storage unit 102 may be overwritten with the new correction value.

(Temperature Control Process)

Figure 6:
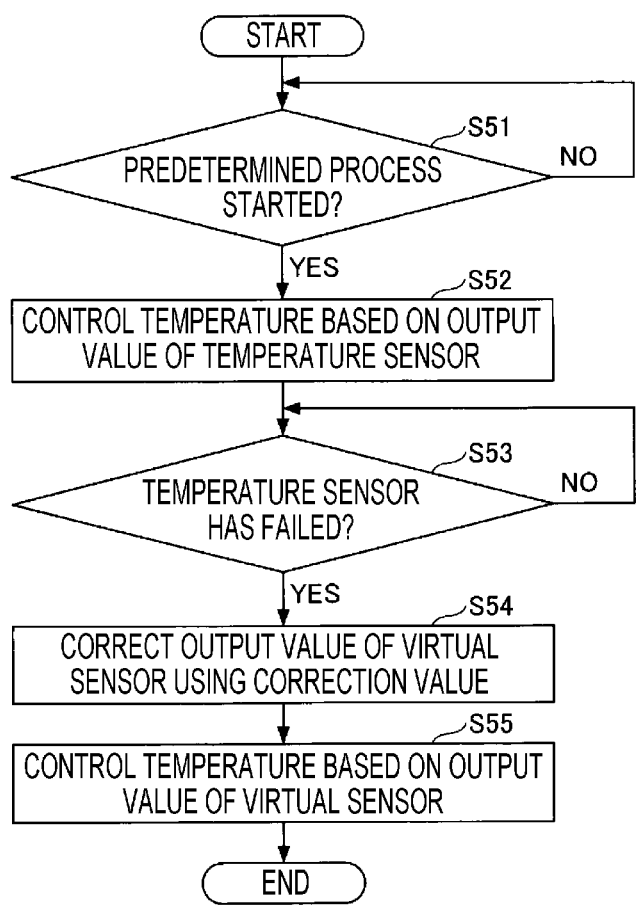
FIG. 6 is a flowchart illustrating an example of a temperature control process.

Descriptions will be made on a process (hereinafter, referred to as "temperature control process") that is executed during execution of the predetermined process and controls the heaters 70a to 70e based on the output value of at least one of the temperature sensors 80a to 80e and the virtual sensor. FIG. 6 is a flowchart illustrating an example of a temperature control process. As illustrated in FIG. 6, the temperature control process includes steps S51 to S55.

In step S51, the controller 100 determines whether the predetermined process has been started. The predetermined process may be, for example, a film forming process or a cleaning process. When it is determined in step S51 that the predetermined process has been started, the process proceeds to step S52. Meanwhile, when it is determined in step S51 that the predetermined process has not been completed, step S51 is repeated.

In step S52, the controller 100 controls the temperature of the wafer W based on the output values of the temperature sensors 80a to 80e. Specifically, the controller 100 calculates set values of the power controllers 72a to 72e based on detection signals (output values) from the temperature sensors 80a to 80e, and outputs the calculated set values to each of the power controllers 72a to 72e to control the amount of heat generated by the heaters 70a to 70e.

In step S53, the controller 100 determines (monitors) whether the temperature sensors 80a to 80e have failed. The determination as to whether the temperature sensors 80a to 80e have failed is performed based on, for example, the amount of change in the detection signals (output values) from the temperature sensors 80a to 80e. For example, when the temperature sensors 80a to 80e are thermocouples, it is possible to determine whether the temperature sensors 80a to 80e have failed (e.g., broken) based on the amount of change in the electromotive force of the thermocouple. When it is determined in step S53 that at least one of the temperature sensors 80a to 80e has failed, the process proceeds to step S54. Meanwhile, when it is determined in step S53 that at least one of the temperature sensors 80a to 80e has failed, step S53 is repeated.

In step S54, the controller 100 corrects the output value of the virtual sensor using the correction value calculated by the correction value calculation process. In an embodiment, the controller 100 acquires, from the storage unit 102, a correction value calculated after executing the same process as the process being executed, and corrects the output value of the virtual sensor using the acquired correction value. Further, when a plurality of correction values calculated after executing the same process as the process being executed is stored in the storage unit 102, the controller 100 may acquire the most recently stored correction value from the storage unit 102. Thus, control accuracy using the virtual sensor may be particularly improved. Further, when the correction value calculated after executing the same process as the process being executed is not stored in the storage unit 102, the controller 100 may output a warning message or issue an alarm without performing the correction.

In step S55, the controller 100 switches from a control of the heaters 70a to 70e based on the output values of the temperature sensors 80a to 80e to a control of the heaters 70a to 70e based on the output value of the virtual sensor corrected in step SM. Thus, even when the temperature sensors 80a to 80e have failed, the temperature control of the heaters 70a to 70e may be continued.

(Effect)

Figure 7A:
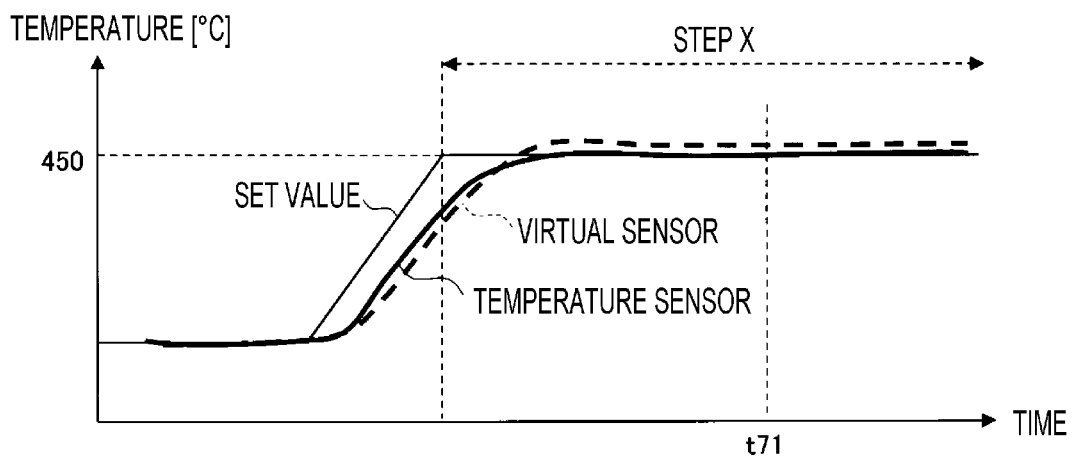
FIGS. 7A and 7B are diagrams illustrating a time change in temperature when temperature is controlled by a control method according to an embodiment.
Figure 7B:
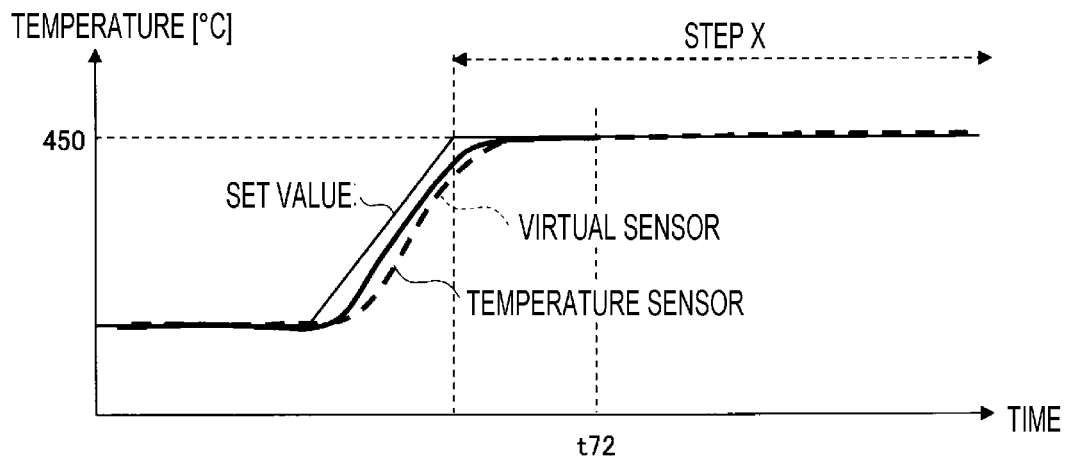

The effect of controlling the temperature by the control method according to an embodiment will be described. FIGS. 7A and 7B are diagrams illustrating a time change in temperature when temperature is controlled by the control method according to the embodiment. FIG. 7A represents the set value of the temperature, the output value of the temperature sensor 80, and the output value of the virtual sensor in the predetermined process which is executed immediately before the correction value calculation process. FIG. 7B represents an output value of the temperature sensor 80 and an output value of the virtual sensor when it is determined that the temperature sensor 80 has failed during execution of the predetermined process. In FIGS. 7A and 7B, the horizontal axis and the vertical axis respectively indicate time and temperature [° C.], a thin solid line indicates a set value, a thick solid line indicates an output value of the temperature sensor 80, and a broken line indicates an output value of a virtual sensor.

According to the control method of the embodiment, as illustrated in FIG. 7A, after the end of the predetermined process, the output value of the virtual sensor (see the broken line in the figure) is calculated based on the output value of the temperature sensor 80 (see the thick solid line in the figure) when the predetermined process is executed. Further, a correction value is calculated based on the output value of the temperature sensor 80 and the output value of the virtual sensor when the predetermined process is executed. In the example illustrated in FIG. 7A, the correction value is calculated as a difference between the output value of the virtual sensor and the output value of the temperature sensor 80 at time t71, and is stored in the storage unit 102. However, the correction value may be calculated, for example, as an average value of the difference between the output value of the virtual sensor and the output value of the temperature sensor 80 at a plurality of times in step X, and may be stored in the storage unit 102.

Further, as illustrated in FIG. 7B, when the temperature sensor 80 fails during the execution of the predetermined process, the output value of the virtual sensor is corrected by the correction value calculated by the correction value calculation process, and then a control based on the output value of the temperature sensor 80 is switched to a control based on the output value of the virtual sensor. In the example illustrated in FIG. 7B, at time t72, the temperature sensor 80 fails, and at time t72, the control based on the output value of the temperature sensor 80 is switched to the control based on the output value of the virtual sensor. As illustrated in FIG. 7B, it may be seen that there is almost no difference between the output value of the temperature sensor 80 and the output value of the virtual sensor until the time t72 when the temperature sensor 80 fails in the predetermined step X. Therefore, even when the control based on the output value of the temperature sensor 80 is switched to the control based on the output value of the virtual sensor at time t72, the temperature of the wafer W may be controlled to be substantially constant. That is, the heater 70 to be controlled may be controlled with high accuracy using the virtual sensor.

Next, for comparison, descriptions will be made on a case in which a recipe prepared to calculate a correction value (hereinafter, referred to as a "correction value calculation recipe") is executed between step S1 of checking the state of an apparatus and step S2 of performing production, whereby a correction value of the virtual sensor is calculated, and the virtual sensor is corrected based on the calculated correction value. The correction value calculation recipe is a sequence recipe in which the change of the set value of the temperature is sequentially advanced in a predetermined order.

Figure 8A:
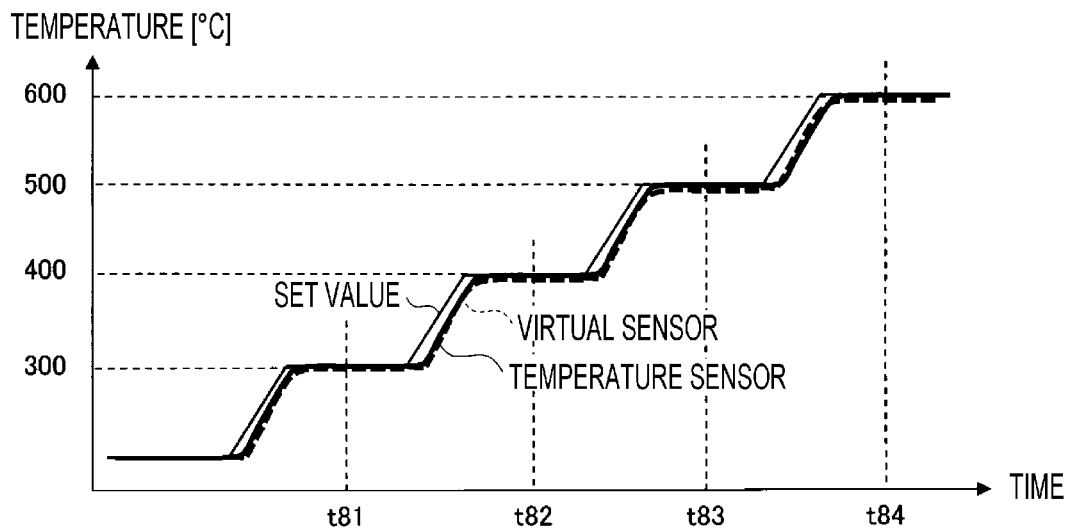
FIGS. 8A and 8B are diagrams illustrating a temporal change in temperature when temperature is controlled by a control method of a comparative example.
Figure 8B:
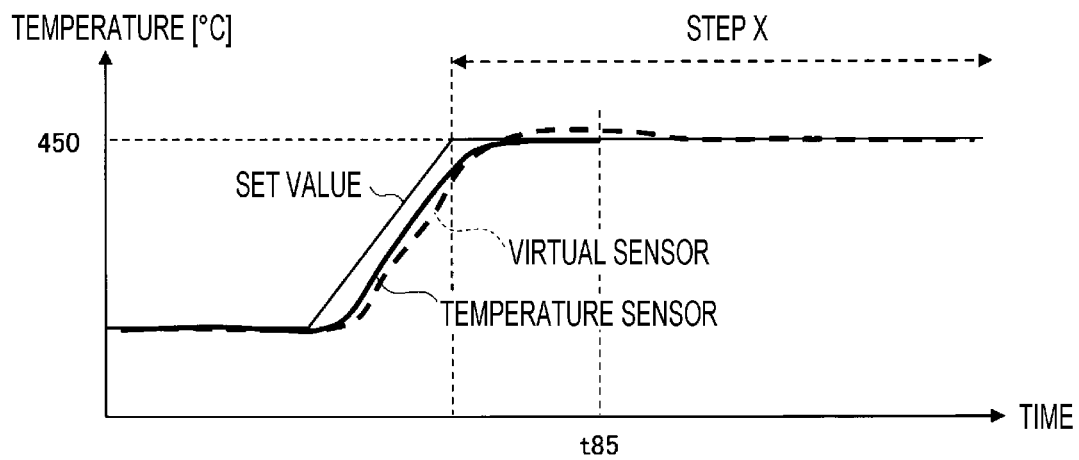

FIGS. 8A and 8B are diagrams illustrating a temporal change in temperature when temperature is controlled by a control method of a comparative example. FIG. 8A represents the set value of the temperature, the output value of the temperature sensor 80, and the output value of the virtual sensor in the process which is executed using the correction value calculation recipe. FIG. 8B represents the output value of the temperature sensor 80 and the output value of the virtual sensor when it is determined that the temperature sensor 80 has failed during the execution of the predetermined process. In FIGS. 8A and 8B, the horizontal axis and the vertical axis respectively indicate time and temperature [° C.], a thin solid line indicates a set value, a thick solid line indicates an output value of the temperature sensor 80, and a broken line indicates an output value of a virtual sensor.

According to the control method of the comparative example, as illustrated in FIG. 8A, the output value of the virtual sensor (see the broken line in the figure) is calculated based on the output value of the temperature sensor 80 (see the thick solid line in the figure) when the process is executed using the correction value calculation recipe. Further, a correction value is calculated based on the output value of the temperature sensor 80 and the output value of the virtual sensor when the process is executed. In the example illustrated in FIG. 8A, the correction value is calculated as a difference between the output value of the virtual sensor and the output value of the temperature sensor 80 at times t81, t82, t83, and t84, and is stored in the storage unit 102. In other words, the correction value is calculated as a difference between the output value of the virtual sensor and the output value of the temperature sensor 80 when the set temperature is 300° C., 400° C., 500° C., and 600° C., respectively, and is stored in the storage unit 102.

Further, as illustrated in FIG. 8B, when the temperature sensor 80 fails during the execution of the predetermined process, the output value of the virtual sensor is corrected by the correction value calculated by the correction value calculation process, and then a control based on the output value of the temperature sensor 80 is switched to a control based on the output value of the virtual sensor. In the example illustrated in FIG. 8B, at time t85, the temperature sensor 80 fails, and at time t85, the control based on the output value of the temperature sensor 80 is switched to the control based on the output value of the virtual sensor. As illustrated in FIG. 8B, it may be seen that there is almost no difference between the output value of the temperature sensor 80 and the output value of the virtual sensor until the time t85 when the temperature sensor 80 fails in the predetermined step X. Therefore, when the control based on the output value of the temperature sensor 80 is switched to the control based on the output value of the virtual sensor at time t85, since the output value of the virtual sensor is controlled to be equal to the set value, the temperature of the wafer W becomes lower than the actual temperature. That is, it is difficult to control the heater 70 to be controlled with high accuracy using the virtual sensor.

The reason why the control method of the embodiment described above may control the heater 70 to be controlled to a higher degree using the virtual sensor as compared with the control method of the comparative example is considered as follows.

In the control method according to the embodiment, a correction value is calculated based on the output value of the temperature sensor 80 at the time when the process executed immediately before is executed, which is the same process as the predetermined process executed when the temperature sensor 80 fails, and the output value of the virtual sensor is corrected based on the correction value. Therefore, the heater 70 to be controlled may be controlled with high accuracy using the virtual sensor.

In the control method of the comparative example, the correction value is calculated based on the output value of the temperature sensor 80 when the process is performed between step S1 of checking the state of the apparatus and step S2 of performing production and performed using the correction value calculation recipe. Then, the output value of the virtual sensor is corrected based on the correction value. Therefore, the set temperature when calculating the correction value may be different from the set temperature when correcting the output value of the virtual sensor based on the correction value. Further, the timing of calculating the correction value may be greatly different from the timing of correcting the output value of the virtual sensor based on the correction value. As a result, even when the output value of the virtual sensor is corrected based on the correction value, since an error occurs between the output value of the temperature sensor 80 and the output value of the virtual sensor corrected based on the correction value, it is difficult to control the heater 70 to be controlled to a high degree using the virtual sensor.

(Method of Calculating Correction Value)

Figure 9:
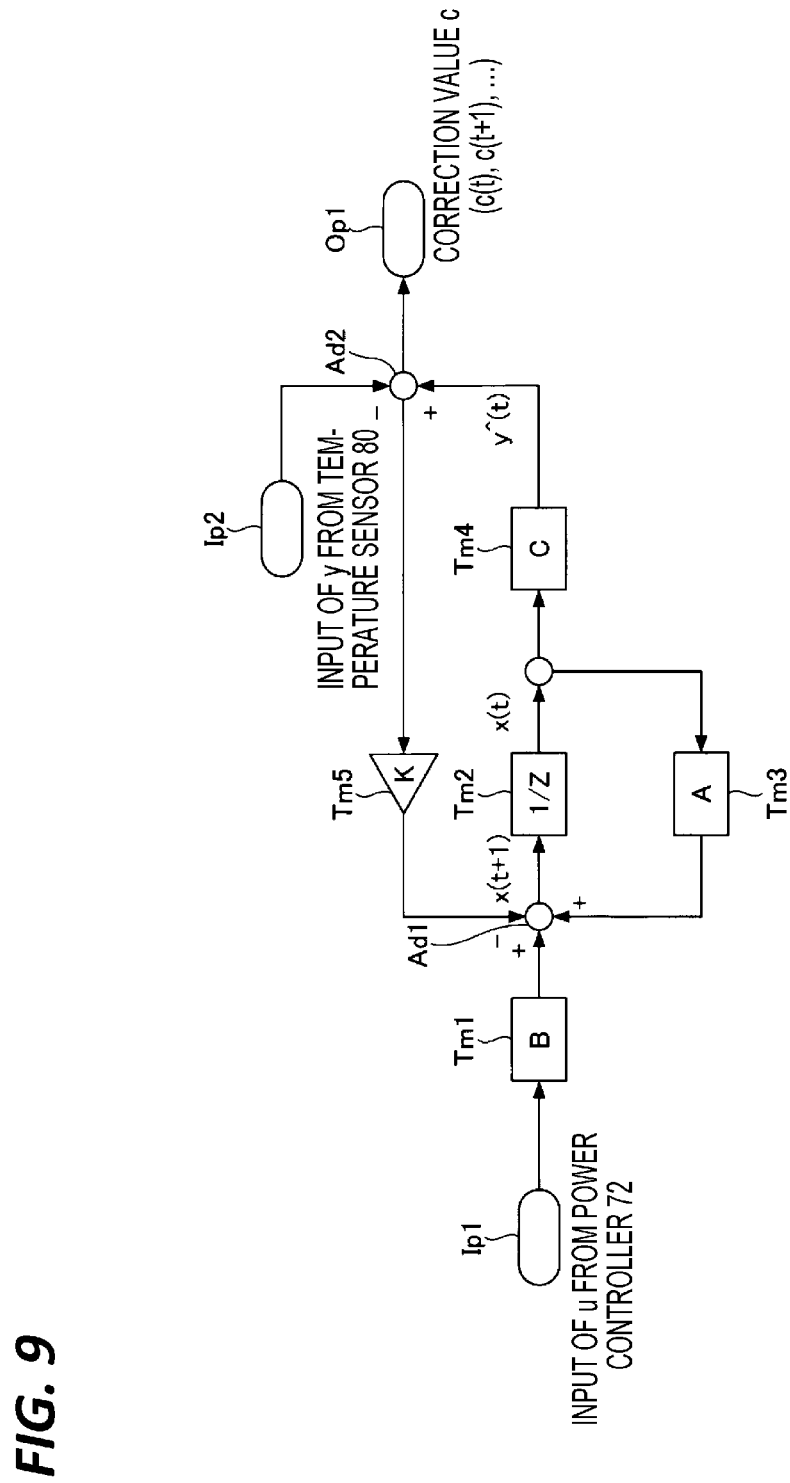
FIG. 9 is a block diagram illustrating a flow of calculating a correction value based on an output value of a virtual sensor and an output value of a temperature sensor.

A specific example of a correction value calculation method executed in the correction value calculation process will be described. FIG. 9 is a block diagram illustrating a flow of calculating a correction value based on an output value of a virtual sensor and an output value of a temperature sensor.

As illustrated in FIG. 9, an output u[u(t), u(t+1), ...] from the power controller 72 is input from an input point Ip1. The output u input from the input point Ip1 is input to an addition point Ad1 after being multiplied by an input matrix B in a transfer element Tm1. Further, after the signal output from the addition point Ad1 is delayed by one unit time in a transfer element Tm2, a signal obtained by multiplying a state matrix A by a transfer element Tm3 is input to the addition point Ad1.

The signal obtained by adding and subtracting two signals at the addition point Ad1 is output from the addition point Ad1, passes through the transfer element Tm2, and is then multiplied by an output matrix C at a transfer element Tm4. The signal multiplied by the output matrix C is input to an addition point Ad2 as an output vector [yˆ(t)]. Further, a temperature detection signal y [y(t), y(t+1), ...] from the temperature sensor 80 input from an input point Ip2 is input to the addition point Ad2. The signal obtained by adding and subtracting the two signals at the addition point Ad2 is multiplied by the Kalman gain K in a transfer element Tm5 and input to the addition point Ad1.

The signal obtained by adding and subtracting the two signals at the addition point Ad2 is output from the addition point Ad2, and is output from an output point Op1 as a correction value c[c(t), c(t+1), ...].

As described above, the output value of the virtual sensor is calculated as the output vector [yˆ(t)], and the correction value of the virtual sensor is calculated as the correction value c.

In the above-described embodiment, a batch-type apparatus that processes a plurality of wafers at a time has been described as an example of the heat treatment apparatus. However, the present disclosure is not limited thereto. For example, the heat processing apparatus may be a single-wafer processing apparatus which processes wafers one by one. In addition, the heat processing apparatus may be, for example, a semi-batch type apparatus which forms a film on a wafer by revolving a plurality of wafers disposed on a rotating table in a processing container by a rotating table, and sequentially passing through a region to which a source gas is supplied and a region to which a reaction gas that reacts with the source gas is supplied.

In the above-described embodiment, descriptions have been made on the control method of controlling the control target based on the output value of at least one of the real sensor and the virtual sensor during the execution of the predetermined process. However, the present disclosure is not limited thereto. For example, during execution of the predetermined process, only the output value of at least one of the real sensor and the virtual sensor may be measured. In this measurement method, a measurement process is performed instead of the temperature control process in the above-described control method. The measurement process includes, for example, the following steps S61 to S65.

In step S61, the controller 100 determines whether the predetermined process has been started. The predetermined process may be, for example, a film forming process or a cleaning process. When it is determined in step S61 that the predetermined process has been started, the process proceeds to step S62. Meanwhile, when it is determined in step S61 that the predetermined process has not been ended, step S61 is repeated.

In step S62, the controller 100 measures the output values of the temperature sensors 80a to 80e.

In step S63, the controller 100 determines (monitors) whether the temperature sensors 80a to 80e have failed. The determination as to whether the temperature sensors 80a to 80e have failed is performed based on, for example, the amount of change in the detection signals (output values) from the temperature sensors 80a to 80e. For example, when the temperature sensors 80*a* to 80*e* are thermocouples, it is possible to determine whether the temperature sensors 80*a* to 80*e* have failed (e.g., broken) based on the amount of change in the electromotive force of the thermocouple. When it is determined in step S63 that at least one of the temperature sensors 80*a* to 80*e* has failed, the process proceeds to step S64. Meanwhile, when it is determined in step S63 that at least one of the temperature sensors 80*a* to 80*e* has failed, step S63 is repeated.

In step S64, the controller 100 corrects the output value of the virtual sensor using the correction value calculated by the correction value calculation process. In an embodiment, the controller 100 acquires, from the storage unit 102, a correction value calculated after executing the same process as the process being executed, and corrects the output value of the virtual sensor using the acquired correction value. Further, when a plurality of correction values calculated after executing the same process as the process being executed is stored in the storage unit 102, the controller 100 may acquire the most recently stored correction value from the storage unit 102. Thus, the measurement accuracy using the virtual sensor may be particularly improved. Further, when the correction value calculated after executing the same process as the process being executed is not stored in the storage unit 102, the controller 100 may output a warning message or issue an alarm without performing the correction.

In step S65, the controller 100 switches from a measurement of the output values of the temperature sensors 80*a* to 80*e* to a measurement of the output value of the virtual sensor corrected in step S64. Thus, even when the temperature sensors 80*a* to 80*e* have failed, the measurement of the temperature distribution along the vertical direction in the processing container 10 may be continued.

In the above embodiment, descriptions have been made on a case where the real sensor is a temperature sensor, and the control target is a heater as an example. However, the present disclosure is not limited thereto. For example, the real sensor may be a pressure gauge (not illustrated), and the control target may be the pressure regulating valve 66.

According to the present disclosure, the control target may be controlled with high accuracy using the virtual sensor.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment apparatus comprising:
   a processing container;
   a substrate holder that holds a plurality of substrates substantially horizontally at predetermined intervals along a vertical direction in the processing container;
   a plurality of heaters that are divided along the vertical direction and heat the substrate held in the processing container;
   a plurality of temperature sensors provided corresponding to the plurality of heaters along the vertical direction; and
   a control circuitry configured to execute a control process including:
   controlling each of the heaters based on an output value of at least one of the temperature sensor and a virtual sensor while a predetermined process including a plurality of steps is in execution on the plurality of substrates in the processing container;
   calculating, after a first execution of the predetermined process is completed, a correction value for each of the plurality of steps of the predetermined process based on an output value of the temperature sensor and an output value of the virtual sensor during the first execution of the predetermined process, and
   storing the correction value in association with each of the plurality of steps of the predetermined process,
   wherein in a second execution of the predetermined process after the first execution of the predetermined process is completed, the controlling includes:
   controlling each of the heaters based on an output value of the temperature sensor while monitoring a failure of the temperature sensor;
   in response to a failure of the temperature sensor during a first step of the plurality of steps, correcting an output value of the virtual sensor with the correction value calculated for the first step of the plurality of steps in the first execution of the predetermined process; and
   switching from a control based on the output value of the temperature sensor to a control based on the output value of the virtual sensor after the correcting the output value of the virtual sensor, and
   wherein in each of the first execution and the second execution of the predetermined process, the plurality of substrates are loaded into the processing container and taken out from the processing container.

2. The heat treatment apparatus according to claim 1, wherein the correction value is an average value of differences between the output value of the temperature sensor and the output value of the virtual sensor at a plurality of time points during the first execution of each of the plurality of steps of the predetermined process.

3. The heat treatment apparatus according to claim 2, wherein the output value of the virtual sensor is calculated based on the output value of the temperature sensor at a plurality of time points when the temperature sensor does not fail.

4. The heat treatment apparatus according to claim 1, wherein the correction value is an average value of differences between the output value of the temperature sensor and the output value of the virtual sensor at a plurality of time points during the first execution of the predetermined process.

5. The heat treatment apparatus according to claim 1, wherein the output value of the virtual sensor is calculated based on the output value of the temperature sensor at a plurality of time points when the temperature sensor does not fail.

6. The heat treatment apparatus according to claim 1, wherein the controlling further includes:
   after the first execution of the predetermined process is completed, estimating the output value of the virtual sensor during the first execution of the predetermined process based on the output value of the temperature sensor during the first execution of the predetermined process such that the correction value is calculated based on the output value of the temperature sensor and the estimated output value of the virtual sensor during the first execution of the predetermined process.

7. The heat treatment apparatus according to claim 1, wherein in the second execution of the predetermined process after the first execution of the predetermined process is completed, the controlling further includes:

in response to a failure of the temperature sensor during a second step of the plurality of steps subsequent to the first step, correcting the output value of the virtual sensor with the correction value calculated for the second step of the plurality of steps in the first execution of the predetermined process.

8. The heat treatment apparatus according to claim 1, wherein the processing container is divided into a plurality of unit regions in which the plurality of temperature sensors are provided, respectively, and the storing the correction value includes storing the correction value in association with each of the plurality of unit regions of the processing container.

9. A heat treatment apparatus comprising:
a processing container;
a substrate holder that holds a plurality of substrates substantially horizontally at predetermined intervals along a vertical direction in the processing container;
a plurality of heaters that are divided along the vertical direction and heat the substrate held in the processing container;
a plurality of temperature sensors provided corresponding to the plurality of heaters along the vertical direction; and
a control circuitry configured to execute a control process including:
measuring an output value of at least one of the temperature sensor and a virtual sensor while a predetermined process including a plurality of steps is in execution on the plurality of substrates in the processing container; and
calculating, after a first execution of the predetermined process is completed, a correction value for each of the plurality of steps of the predetermined process based on an output value of the temperature sensor and an output value of the virtual sensor during the first execution of the predetermined process, and storing the correction value in association with each of the plurality of steps of the predetermined process, wherein in a second execution of the predetermined process after the first execution of the predetermined process is completed, the measuring includes:

measuring an output value of the temperature sensor while monitoring a failure of the temperature sensor;

in response to a failure of the temperature sensor during a first step of the plurality of steps, correcting the output value of the virtual sensor with the correction value calculated for the first step of the plurality of steps in the first execution of the predetermined process; and switching from the measuring the output value of the temperature sensor to measuring the output value of the virtual sensor after the correcting the output value of the virtual sensor.

10. The heat treatment apparatus according to claim 9, wherein the controlling further includes:

after the first execution of the predetermined process is completed, estimating the output value of the virtual sensor during the first execution of the predetermined process based on the output value of the temperature sensor during the first execution of the predetermined process such that the correction value is calculated based on the output value of the temperature sensor and the estimated output value of the virtual sensor during the first execution of the predetermined process.

\* \* \* \* \*